(12) United States Patent
Shen et al.

(10) Patent No.: US 10,623,614 B2
(45) Date of Patent: Apr. 14, 2020

(54) CAMERA MODULE

(71) Applicant: NANCHANG O-FILM OPTICAL-ELECTRONIC TECH CO., LTD., Nanchang (CN)

(72) Inventors: Chengzhe Shen, Nanchang (CN); Jun Feng, Nanchang (CN); Shumin Zhu, Nanchang (CN); Shengyun Zhang, Nanchang (CN); Wenhua Shuai, Nanchang (CN); Dong Tang, Nanchang (CN)

(73) Assignee: NANCHANG O-FILM OPTICAL-ELECTRONIC TECH CO., LTD., Nanchang (CN)

( * ) Notice: Subject to any disclaimer, the term of this patent is extended or adjusted under 35 U.S.C. 154(b) by 31 days.

(21) Appl. No.: 16/132,387

(22) Filed: Sep. 15, 2018

(65) Prior Publication Data

US 2019/0089885 A1    Mar. 21, 2019

(30) Foreign Application Priority Data

Sep. 15, 2017    (CN) ............... 2017 2 1212661 U

(51) Int. Cl.
*H01L 27/146* (2006.01)
*H04N 5/225* (2006.01)
(Continued)

(52) U.S. Cl.
CPC ........... *H04N 5/2252* (2013.01); *G02B 7/021* (2013.01); *G02B 7/025* (2013.01);
(Continued)

(58) Field of Classification Search
CPC .. H04N 5/2252; H04N 5/2253; H04N 5/2254; G02B 7/025; G02B 7/021;
(Continued)

(56) References Cited

U.S. PATENT DOCUMENTS 7,294,828 B2 * 11/2007 Kinoshita .............. H04N 1/024
250/239
2016/0320584 A1 * 11/2016 Lee ....................... G02B 27/646
(Continued)

OTHER PUBLICATIONS

US Office Action dated Oct. 7, 2019, issued on U.S. Appl. No. 16/132,295 in the name of Nanchang O-Film Optical-Electronic Tech Co., Ltd.
(Continued)

*Primary Examiner* — Mekonnen D Dagnew
(74) *Attorney, Agent, or Firm* — Franklin & Associates International Inc

(57) ABSTRACT

A camera module includes a circuit board, a photosensitive chip coupled to the circuit board and having a photosensitive surface, a package material body attached on the circuit board, and a support member mounted on a side of the package material body away from the circuit board. The photosensitive surface includes a photosensitive region. The support member includes a support body and an extension structure. A side of the support body adjacent to the package material body is coplanar with a side of the extension structure adjacent to the package material body, and an orthographic projection of the extension structure on the photosensitive surface is spaced apart from the photosensitive region.

17 Claims, 6 Drawing Sheets

(51) Int. Cl.
  *H01L 33/54* (2010.01)
  *G02B 7/02* (2006.01)
  *H01L 23/00* (2006.01)
  *G02B 7/00* (2006.01)
  *H01L 33/62* (2010.01)

(52) U.S. Cl.
  CPC .. *H01L 27/14618* (2013.01); *H01L 27/14625* (2013.01); *H01L 33/54* (2013.01); *H04N 5/2253* (2013.01); *H04N 5/2254* (2013.01); *G02B 7/006* (2013.01); *H01L 24/48* (2013.01); *H01L 27/14683* (2013.01); *H01L 33/62* (2013.01); *H01L 2224/32225* (2013.01); *H01L 2224/48091* (2013.01); *H01L 2224/48105* (2013.01); *H01L 2224/48225* (2013.01); *H01L 2224/48227* (2013.01); *H01L 2224/73265* (2013.01)

(58) Field of Classification Search
  CPC ... G02B 7/006; H01L 27/14625; H01L 33/54; H01L 27/14618; H01L 2224/73265; H01L 2224/48227; H01L 2224/32225; H01L 33/62; H01L 27/14683; H01L 2224/48225; H01L 2224/48105; H01L 24/48; H01L 2224/48091
  See application file for complete search history.

(56) References Cited

U.S. PATENT DOCUMENTS

| | | |
|---|---|---|
| 2018/0007244 A1 | 1/2018 | Wang et al. |
| 2019/0008988 A1 | 3/2019 | Eder et al. |
| 2019/0086771 A1 | 3/2019 | Shen et al. |
| 2019/0088698 A1 | 3/2019 | Shen et al. |
| 2019/0088699 A1 | 3/2019 | Shen et al. |
| 2019/0089881 A1 | 3/2019 | Shen et al. |
| 2019/0089882 A1 | 3/2019 | Shen et al. |
| 2019/0089883 A1 | 3/2019 | Shen et al. |
| 2019/0148429 A1* | 5/2019 | Wang ............... H05K 1/0274 348/294 |
| 2019/0165019 A1 | 5/2019 | Wang et al. |

OTHER PUBLICATIONS

Non-Final Office Action dated Aug. 7, 2019 issued on U.S. Appl. No. 16/132,260 to Nanchang O-Film Optical-Electronic Tech Co., Ltd.

* cited by examiner

CAMERA MODULE

CROSS-REFERENCE TO RELATED APPLICATIONS

This application claims priority to Chinese Patent Application No. 2017212126616, entitled "CAMERA MODULE" filed Sep. 15, 2017, the contents of which is expressly incorporated herein by reference in its entirety.

TECHNICAL FIELD

The present disclosure relates to camera technologies, and more particularly relates to a camera module.

BACKGROUND

As shown in FIG. 1, a conventional camera module 10 includes a circuit board 11, a photosensitive chip 12 located on the circuit board 11, a package material body 13 attached on the circuit board 11 and extending onto the photosensitive chip 12, electronic components 14 and conductive wires 15 in the package material body 13, a filter 16, and a lens assembly. The lens assembly includes a barrel 17 and a plurality of lenses (not shown) received in the barrel 17. A stepped hole for receiving the filter 16 is defined on a surface of the package material body 13 away from the circuit board 11. The surface of the package material body 13 away from the circuit board 1 is further used to connect to the barrel 17. As a carrier of the filter 16 and the lens assembly, the package material body 13 needs to have a certain strength. This requires the package material body 13 to have a certain size in each of three directions along X, Y, and Z axes. However, as an optical axis 10a of the camera module 10 is parallel to the Z axis, the larger the length of the package material body 13 in the Z axis direction, the harder for controlling a central axis of a light transmission hole of the package material body 13 to be coaxial with the optical axis 10a. This makes it harder to obtain a camera module having higher imaging quality.

SUMMARY

According to various embodiments of the present disclosure, a camera module is provided.

A camera module includes a circuit board, a photosensitive chip coupled to the circuit board and having a photosensitive surface, a package material body attached on the circuit board, and a support member mounted on a side of the package material body away from the circuit board. The photosensitive surface includes a photosensitive region. The support member includes a support body and an extension structure formed on an inner wall of the support body. A side of the support body adjacent to the package material body is coplanar with a side of the extension structure adjacent to the package material body. An orthographic projection of the extension structure on the photosensitive surface is spaced apart from the photosensitive region.

The details of one or more implementations of the subject matter described in this specification are set forth in the accompanying drawings and the description below. Other potential features, aspects, and advantages of the subject matter will become apparent from the description, the drawings, and the claims.

BRIEF DESCRIPTION OF THE DRAWINGS

To illustrate the technical solutions according to the embodiments of the present disclosure or in the prior art more clearly, the accompanying drawings for describing the embodiments or the prior art are introduced briefly in the following. Apparently, the accompanying drawings in the following description are only some embodiments of the present disclosure, and persons of ordinary skill in the art can derive other drawings from the accompanying drawings without creative efforts.

DETAILED DESCRIPTION OF THE EMBODIMENTS

Reference will now be made to the drawings to describe, in detail, embodiments of the present camera module. It should be noted that references to "an" or "one" embodiment in this disclosure are not necessarily to the same embodiment, and such references mean at least one.

Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively. Additionally, the words "herein," "above," "below" and words of similar import, when used in this application, shall refer to this application as a whole and not to any particular portions of this application. When the claims use the word "or" in reference to a list of two or more items, that word covers all of the following interpretations of the word: any of the items in the list, all of the items in the list and any combination of the items in the list.

Figure 1:
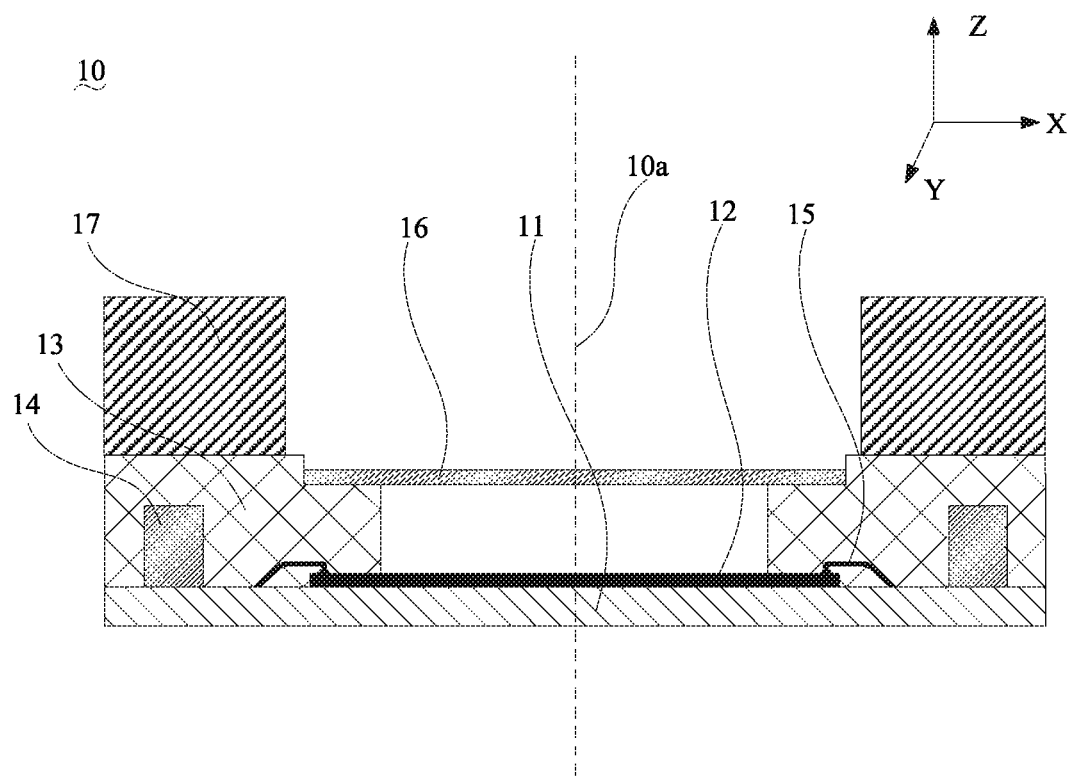
FIG. 1 is a cross-sectional view of a camera module in the prior art.
Figure 2:
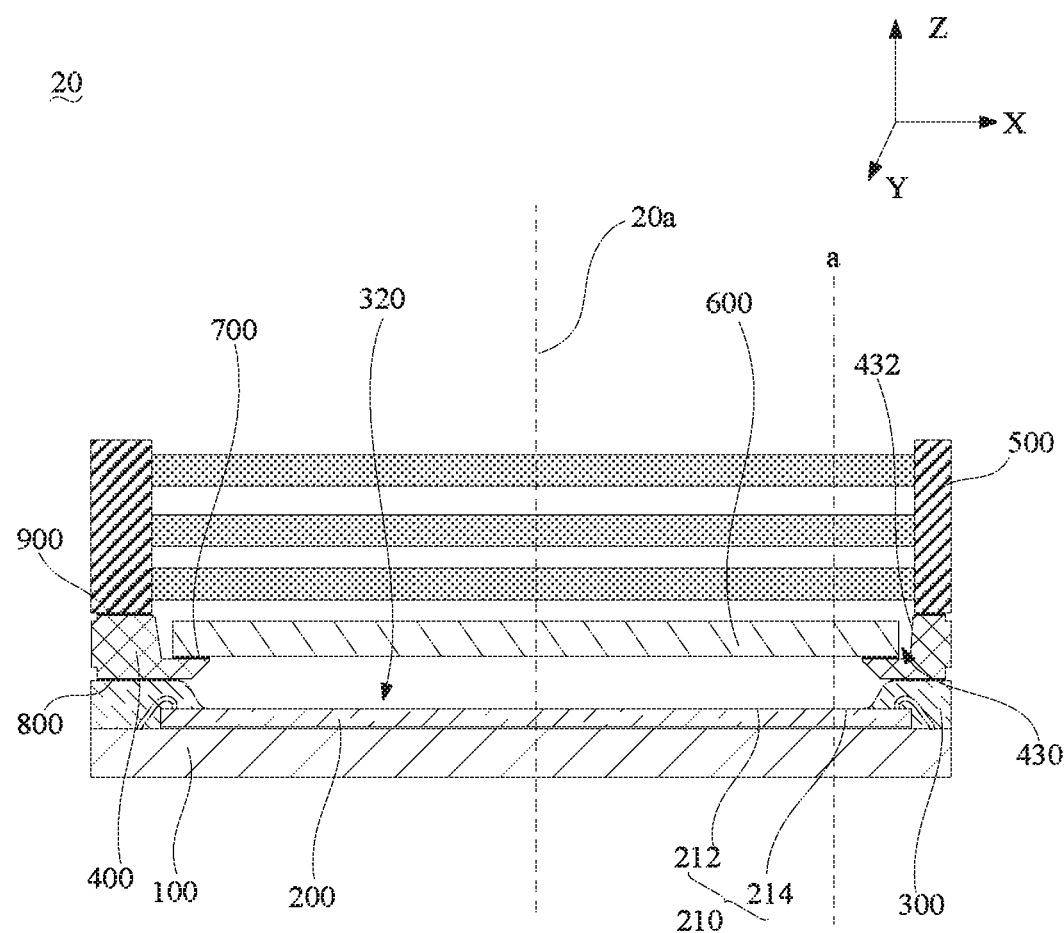
FIG. 2 is a cross-sectional view of a camera module in accordance with an embodiment.

Referring to FIG. 2, a camera module 20 in accordance with an embodiment can be Cuboid-shaped, cylindrical, and etc. In a space coordinate system, the camera module 20 has a certain length in the X-axis direction, a certain width in the Y-axis direction, and a certain distance in the Z-axis direction. The camera module 20 has an optical axis 20a The optical axis 20a is parallel to the Z axis. The camera module 20 includes a circuit board 100, a photosensitive chip 200, a package material body 300, a support member 400, a lens assembly 500, and a filter 600.

The photosensitive chip 200 is located on and electrically coupled to the circuit board 100. The photosensitive chip 200 includes a photosensitive surface 210 away from the circuit board 100. The photosensitive surface 210 includes a photosensitive region 212 and a non-photosensitive region 214 surrounding the photosensitive region 212. A line formed by intersecting of a dotted line a and the photosensitive chip 200 illustrates the junction between the photosensitive region 212 and the non-photosensitive region 214.

Figure 3:
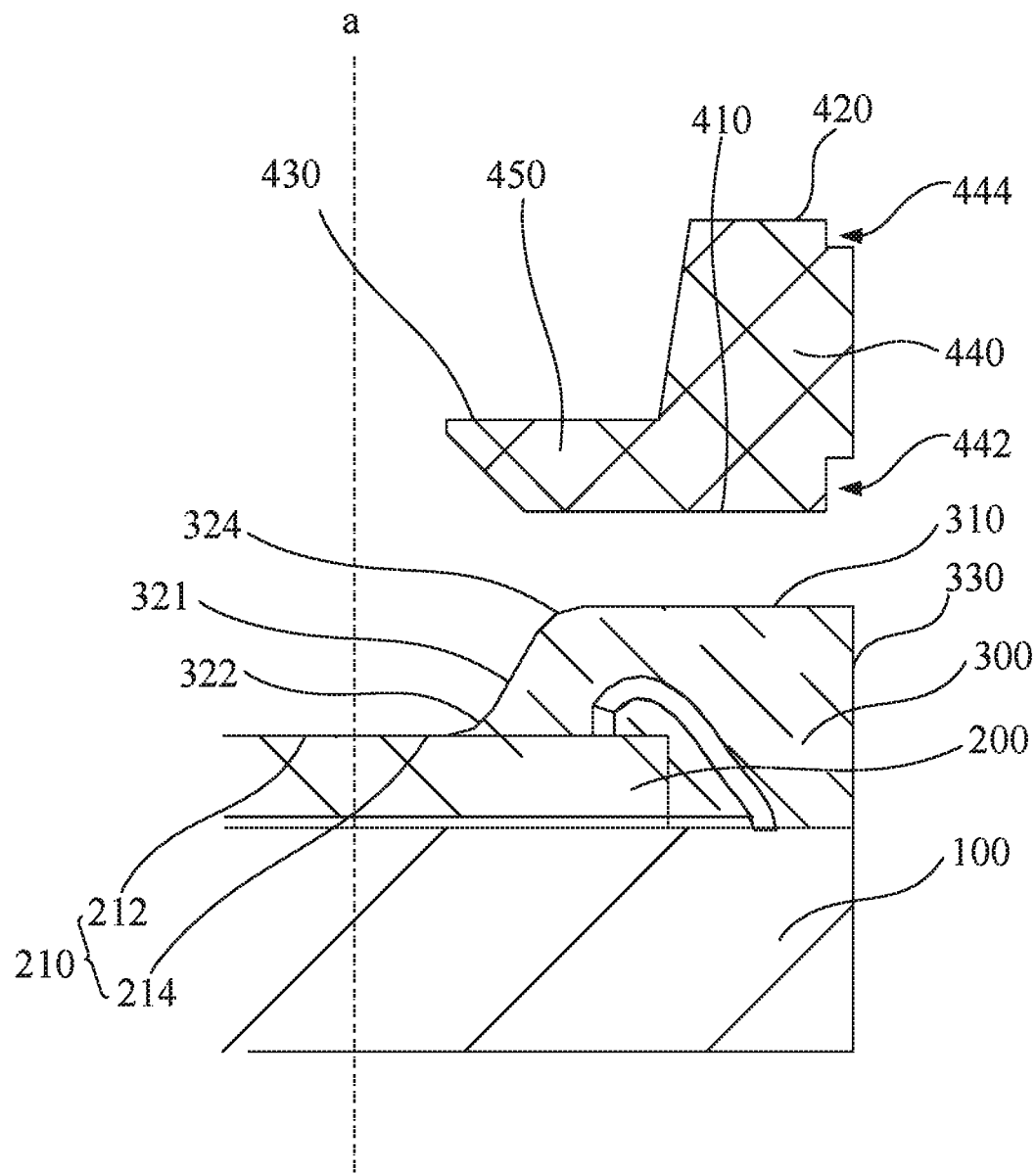
FIG. 3 is an enlarged view illustrating a package material body and a support member of FIG. 2 in a disassembled state.

Referring to FIGS. 2 and 3, the package material body 300 is attached on the circuit board 100. In the illustrated embodiment, the package material body 300 encapsulates a portion of the non-photosensitive region 214. This enhances a connection between the photosensitive chip 200 and the circuit board 100. The remain portion of the non-photosensitive region 214 is exposed. During forming the package material body 300, if the material for forming the package material body 300 leaks out, the exposed portion of the non-photosensitive region 214 can receive the leaked material, thereby preventing the leaked material from flowing to the photosensitive region 212. In other words, the exposed non-photosensitive region 214 can prevent the photosensitive region 212 from being contaminated. In addition, when the package material body 300 extends towards an inside of the non-photosensitive region 214, the size of the package material body 300 in the XY plane can be reduced without changing the bearing strength of the package material body 300.

The package material body 300 includes a bearing surface 310 away from the circuit board 100. The bearing surface 310 is used to hold the support member 400. The package material body 300 defines a light transmission hole 320 in a middle portion thereof corresponding to the photosensitive surface 210. The package material body 300 includes a sidewall 321 in the light transmission hole 320. In the illustrated embodiment, the sidewall 321 is inclined to the optical axis 20a. A distance between the sidewall 321 and the optical axis 20a gradually increases along a direction from the circuit board 100 to the package material body 300. This, on the one hand, can increase the luminous flux incident to the photosensitive surface 210, and on the other hand facilitate a demolding of an injection mold for forming the package material body 300 and avoid damage to the package material body 300. In the illustrated embodiment, a bottom of the light transmission hole 310 is provided with a concave surface 322. The concave surface 322 is recessed toward the outer sidewall 330. This can facilitate the demolding of the injection mold for forming the package material body 300 and avoid the damage to the package material body 300.

In the embodiment, a first round chamfer 324 is provided at a junction of the sidewall 321 and the bearing surface 310, which can facilitate the demolding of the injection mold for forming the package material body 300 on the one hand, and reduce a flow speed of adhesive and deposit excessive adhesive on the other hand when attaching the support member 400 to the package material body 300, since the round chamfer has a greater resistance for the flow of the adhesive than an inclined plane. In addition, the round chamfer has a larger surface area than the inclined plane and can receive more adhesive. Thus the adhesive can be effectively prevented from flowing to the photosensitive region 212.

Figure 4:
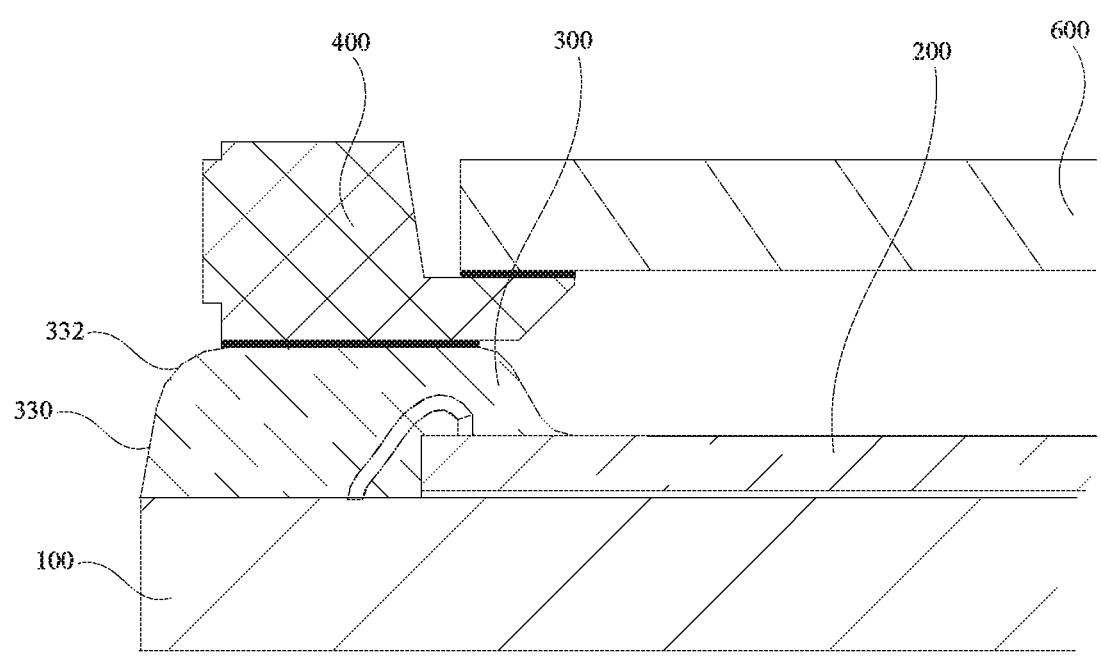
FIG. 4 is an enlarged view of the left side of a camera module in accordance with another embodiment.

The package material body 300 further includes an outer sidewall 330. In the illustrated embodiment of FIG. 4, the outer sidewall 330 is inclined to the optical axis 20a. A distance between the outer sidewall 330 and the optical axis 20a gradually decreases along the direction from the circuit board 100 to the package material body 300. In the illustrated embodiment, a second round chamfer 332 is provided at a junction of the outer sidewall 330 and the bearing surface 310. This can facilitate the demolding of the injection mold for forming the package material body 300 and avoid the damage to the package material body 300.

Figure 5:
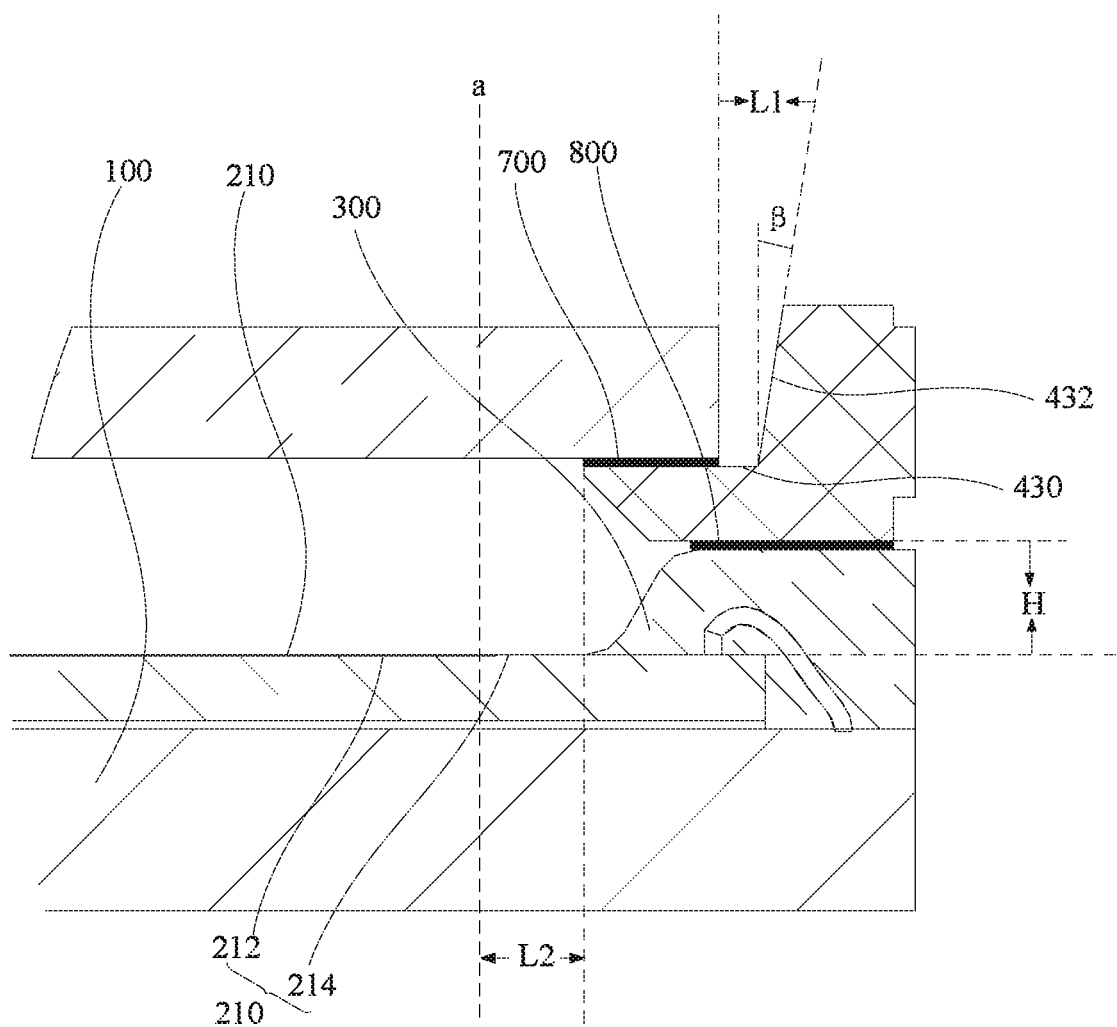
FIG. 5 is a enlarged view of the right side of the camera module of FIG. 2.

Referring to FIGS. 2, 3, and 5, the support member 400 is located on the bearing surface 310. The support member 400 includes opposed first surface 410 and a second surface 420. The first surface 410 connects to the bearing surface 310. In the illustrated embodiment, an orthographic projection of the first surface 410 on the bearing surface 310 is located within the bearing surface 310. A vertical distance H between the first surface 410 and the photosensitive surface 210 ranges from about 150 μm to about 1500 μm. This can prevent light from being blocked by the support member 400, thereby improving an imaging quality of the camera module 20. In one embodiment, the vertical distance H ranges from about 200 μm to 500 μm. Specifically, in the illustrated embodiment, the vertical distance H is 260 μm.

The support member 400 includes a support body 440 and an extension structure 450. In the illustrated embodiment, a side of the support body 440 adjacent to the package material body 300 is coplanar with a side of the extension structure 450 adjacent to the package material body 300. That is, the side of the support body 440 adjacent to the package material body 300 and the side of the extension structure 450 adjacent to the package material body 300 cooperatively define the first surface 410, thereby increasing a connection area between the support member 400 and the package material body 300.

In the embodiment, the support body 440 defines a first notch 442 in an outer sidewall thereof adjacent to the package material body 300. The first notch 442 can be used to receive excess adhesive when attaching the support member 400 to the package material body 300, thereby preventing the adhesive from flowing along the outer sidewall 330.

In the illustrated embodiment, the support body 440 defines a second notch 444 in the outer sidewall thereof away from the package material body 300. The second notch 444 can be used to receive excess adhesive when attaching the lens assembly 500 to the support member 400, thereby preventing the adhesive from flowing along the outer sidewall of the support member 400.

The extension structure 450 extends from a lower portion of an inner wall 432 of the support body 440. In the illustrated embodiment, an orthographic projection of the extension structure 450 on the photosensitive surface 210 is located within the non-photosensitive region 214 and spaced apart from the photosensitive region 214, thereby preventing the extension structure 450 from blocking light emitted to the photosensitive region 212.

A distance L2 between a distal end of the orthographic projection of the extension structure 450 away from the support body 440 on the photosensitive surface 210 and the photosensitive region 212 ranges from about 100 μm to 500 μm. This can prevent the extension structure 450 from blocking the light emitted to the photosensitive region 212, and can also ensure that the extension structure 450 and the bearing surface 310 have a large enough connection area. In one embodiment, the distance L2 ranges from about 200 μm to about 400 μm. Specifically, in the illustrated embodiment, the distance L2 is 300 μm.

Figure 6:
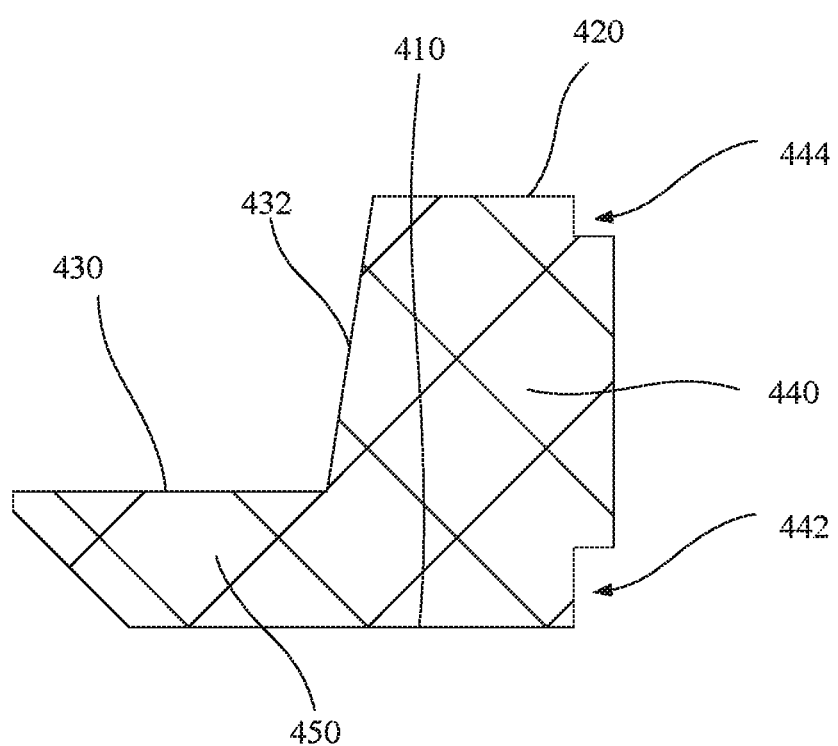
FIG. 6 is a enlarged view of the right side of the support member of FIG. 2.

Referring to FIGS. 2, 5, and 6, the extension structure 450 has a support surface 430 used to support the filter 600. The inner sidewall 432 of the support body 440 is inclined to the optical axis 20a. A distance between the inner sidewall 432 and the optical axis 20a gradually increase along a direction from the circuit board 100 to the support member 400. The inclined inner sidewall 432 can reduce the flow speed of the adhesive and deposit excessive adhesive when attaching the lens assembly 500 to the support member 400, since the inclined sidewall 432 has a greater resistance for the flow of the adhesive than a vertical surface. The inclined inner side wall 432 can also receive more adhesive because of a greater area than the vertical surface. In the illustrated embodiment, an angle β between the sidewall 432 and the optical axis 20a ranges from about 0.5° to about 30°. In one embodiment, the angle β ranges from about 1° to about 10°. This can ensure the strength of the support member 400 for stably supporting the lens assembly 500.

The lens assembly 500 is located on a top side of the support member 400 away from the package material body 300. In the illustrated embodiment, the lens assembly 500 is located on the support body 440.

In the illustrated embodiment, both ends of the filter 600 are located on the support surface 430 and are spaced apart from the support body 440, thus a gap L1 is defined between the filter 600 and the support body 440. The gap L1 can prevent the support body 440 from extruding and breaking the filter 600 when mounting the filter 600. In addition, the gap L1 can receive excessive adhesive when attaching the filter 600 to the support member 400 and attaching the lens assembly 500 to the support member 400.

It should be understood that, in the illustrated embodiment, the camera module 20 further includes a first adhesive layer 700 sandwiched between the extension structure 450 and the filter 600, a second adhesive layer 800 sandwiched between the bearing surface 320 and the first surface 410, and the third adhesive layer 900 sandwiched between the lens assembly 500 and the support body 440.

Compared with a conventional two-stage structure composed of a package material body and a lens assembly, the aforementioned camera module 20 has a three-stage structure composed of the package material body 300, the support member 400, and the lens assembly 500, where part of package material body in the conventional two-stage structure is replaced by the support member, such that the package material body 300 can have a relatively smaller length in the Z-axis direction. The smaller the length of the package material body 300 in the Z-axis direction, the easier the control of an alignment of the optical axis 20a of the camera module is. Thus a camera module 20 with a higher imaging quality is obtained.

During assembling of the camera module 20, the package material body 300 with a smaller length in the Z axis direction is formed firstly by using a fabrication process. The central axis of the light transmission hole 310 of the package material body 300 is aligned with the optical axis 20a when the package material body 300 is finished. Then, the support member 400 provided with the filter 600 is located on the package material body 300. Specifically, the central axis of the support member 400 is aligned with the optical axis 20a via coating adhesive on a side surface of the support body 410 adjacent to the package material body 300 or the bearing surface 320 and adjusting the thickness of the adhesive. Finally, the central axis of the lens assembly 500 is aligned with the optical axis 20a via coating adhesive on a side surface of the support body 410 away from the package material body 300 or coating on the side surface of the lens assembly 500 and adjusting the thickness of the adhesive. The alignment between the central axis of the support member 400 and the optical axis 20a and the alignment between the central axis of the lens assembly 500 and the optical axis 20a are separately controlled, which can reduce the control difficulty of each alignment adjusting, thereby reducing the processing requirement for manufacturing the camera module 20.

It should understood that, in alternative embodiments, the photosensitive chip 200 is completely exposed from the light transmission hole 320 and spaced apart from an inner wall of the package material body 300 in the light transmission hole 320. In that case, the package material body 300 does not encapsulate the non-photosensitive region 214 of the photosensitive chip 200.

It should understood that, in alternative embodiments, the shape and size of the first surface 410 match the shape and size of the bearing surface 310, and the orthographic projection of the first surface 410 on the bearing surface 310 can coincide with the bearing surface 310 to ensure that the support member 400 and the package material body 300 can be completely attached, thereby firmly connecting the support member 400 with the package material body 300.

It should understood that, in alternative embodiments, the first notch 442 and the second notch 444 can be omitted.

It should understood that, in alternative embodiments, the photosensitive surface 210 can merely include the photosensitive region 212.

The technical features of the above embodiments can be arbitrarily combined. For the sake of brevity of description, all possible combinations of the technical features in the above embodiments are not described. However, as long as there is no collision in the combination of these technical features, it should be considered as the scope described in this specification.

The foregoing implementations are merely specific embodiments of the present disclosure, and are not intended to limit the protection scope of the present disclosure. It should be noted that any variation or replacement readily figured out by persons skilled in the art within the technical scope disclosed in the present disclosure shall all fall into the protection scope of the present disclosure. Therefore, the protection scope of the present disclosure shall be subject to the protection scope of the claims.

What is claimed is:

1. A camera module, comprising: a circuit board; a photosensitive chip coupled to the circuit board and having a photosensitive surface, the photosensitive surface comprising a photosensitive region; a package material body attached on the circuit board; and a support member located on a side of the package material body away from the circuit board; wherein the support member comprises a support body and an extension structure located on an inner wall of the support body, a side of the support body adjacent to the package material body is coplanar with a side of the extension structure adjacent to the package material body, and an orthographic projection of the extension structure on the photosensitive surface is spaced apart from the photosensitive region wherein the inner wall of the support body is inclined to an optical axis of the camera module, and a distance between the inner wall of the support body and the optical axis of the camera module gradually increases along a direction from the circuit board to the package material body, wherein an angle between the inner wall of the support body and the optical axis ranges from about 0.50 degrees to about 30 degrees.

2. The camera module according to claim 1, wherein a distance from a distal end of the orthographic projection of the extension structure away from the support body on the photosensitive surface to the photosensitive region ranges from about 100 μm to about 500 μm.

3. The camera module according to claim 2, wherein the distance from the distal end of the orthographic projection of the extension structure away from the support body on the photosensitive surface to the photosensitive region ranges from about 200 μm to about 400 μm.

4. The camera module according to claim 1, wherein the support member comprises a first surface adjacent to the package material body, and a distance between the first surface and the photosensitive surface ranges from about 150 μm to about 1500 μm.

5. The camera module according to claim 4, wherein the distance between the first surface and the photosensitive surface ranges from about 200 μm to about 500 μm.

6. The camera module according to claim 4, wherein the package material body comprises a bearing surface away from the circuit board, and an orthographic projection of the first surface on the bearing surface is located within the bearing surface.

7. The camera module according to claim 1, wherein the angle between the inner wall of the support body and the optical axis of the camera module ranges from about V to about 100.

8. The camera module according to claim 1, further comprising a filter located on the extension structure and spaced apart from the inner wall of the support body.

9. The camera module according to claim 1, further comprising a lens assembly located on the support body.

10. The camera module according to claim 1, wherein the photosensitive surface further comprises a non-photosensitive region surrounding the photosensitive region, and the package material body encapsulates a portion of the non-photosensitive region.

11. The camera module according to claim 1, wherein the package material body defines a light transmission hole in a middle portion thereof, and a bottom of the package material body in the light transmission hole is provided with a concave surface recessed toward an outer sidewall of the package material body.

12. The camera module according to claim 11, wherein a sidewall of the package material body in the light transmission hole is inclined to an optical axis of the camera module.

13. The camera module according to claim 12, wherein the package material body includes a bearing surface away from the circuit board, and a first round chamfer is provided at a junction of the sidewall and the bearing surface.

14. The camera module according to claim 1, wherein an outer sidewall of the package material body is inclined to an optical axis of the camera module.

15. The camera module according to claim 14, wherein the package material body includes a bearing surface away from the circuit board, and a second round chamfer is provided at a junction of the outer sidewall and the bearing surface.

16. The camera module according to claim 1, wherein the support body defines a first notch on an outer sidewall of the support body adjacent to the package material body for receiving excess adhesive when attaching the support member to the package material body.

17. The camera module according to claim 1, wherein the support body defines a second notch on an outer sidewall of the support body away from the package material body for receiving excess adhesive when attaching the lens assembly to the support member.

* * * * *